United States Patent
Lalam et al.

(10) Patent No.: US 10,199,364 B2
(45) Date of Patent: Feb. 5, 2019

(54) NON-VOLATILE DUAL IN-LINE MEMORY MODULE (NVDIMM) MULTICHIP PACKAGE

(71) Applicant: Sanmina Corporation, San Jose, CA (US)

(72) Inventors: Arvindhkumar Lalam, Carlsbad, CA (US); Alec C. Shen, Irvine, CA (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 15/600,690

(22) Filed: May 19, 2017

(65) Prior Publication Data
US 2017/0338213 A1    Nov. 23, 2017

Related U.S. Application Data

(60) Provisional application No. 62/338,514, filed on May 19, 2016.

(51) Int. Cl.
| | |
|---|---|
| *H01L 23/34* | (2006.01) |
| *H01L 25/18* | (2006.01) |
| *H01L 23/00* | (2006.01) |
| *H01L 23/31* | (2006.01) |
| *H01L 23/367* | (2006.01) |

(Continued)

(52) U.S. Cl.
CPC .......... *H01L 25/18* (2013.01); *H01L 23/3107* (2013.01); *H01L 23/3677* (2013.01); *H01L 23/5384* (2013.01); *H01L 24/17* (2013.01); *H01L 24/49* (2013.01); *H01L 23/49811* (2013.01); *H01L 25/0655* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 2924/1436* (2013.01); *H01L 2924/1438* (2013.01); *H01L 2924/15192* (2013.01); *H01L 2924/15311* (2013.01);

(Continued)

(58) Field of Classification Search
CPC . H01L 24/17; H01L 24/49; H01L 2924/1438; H01L 2924/143
USPC .......................... 257/686, 777, 784, 723, 724
See application file for complete search history.

(56) References Cited

U.S. PATENT DOCUMENTS

| | | |
|---|---|---|
| 6,395,582 B1 | 5/2002 | Sohn et al. |
| 6,507,115 B1 | 1/2003 | Hofstee et al. |
| 7,692,278 B2 | 4/2010 | Periaman et al. |
| 7,872,335 B2 | 1/2011 | Khan et al. |
| 7,923,830 B2 | 4/2011 | Pope et al. |

(Continued)

*Primary Examiner* — S. V. Clark
(74) *Attorney, Agent, or Firm* — Loza & Loza, LLP; Heidi L. Eisenhut; Julio M. Loza (57) ABSTRACT

A single multichip package is provided, comprising: a substrate having opposing upper and lower surfaces. A first die is mounted on the upper surface of the substrate and includes one or more non-volatile memory devices. A second die is mounted on the upper surface of the substrate, and includes at least one of: (a) a non-volatile memory controller that facilitates transfer of data to/from the one or more non-volatile memory devices, (b) a register clock driver for volatile memory devices, and/or (c) one or more multiplexer switches configured to switch between two or more of the volatile memory devices. A plurality of wire bonds connect the first and second dies. A plurality of solder balls are located on the lower surface of the substrate for mounting the single multichip package to a printed circuit board, the plurality of solder balls electrically coupled to the first die and the second die.

14 Claims, 8 Drawing Sheets

(51) Int. Cl.
*H01L 23/538* (2006.01)
*H01L 25/065* (2006.01)
*H01L 23/498* (2006.01)

(52) U.S. Cl.
CPC .............. *H01L 2924/181* (2013.01); *H01L 2924/1815* (2013.01); *H01L 2924/301* (2013.01)

(56) References Cited

U.S. PATENT DOCUMENTS

| | | | |
|---|---|---|---|
| 2001/0000046 A1* | 3/2001 | Wright | G06F 15/8053 712/11 |
| 2007/0290322 A1 | 12/2007 | Zhao et al. | |
| 2008/0150579 A1* | 6/2008 | Madurawe | H03K 19/1735 326/38 |
| 2008/0158936 A1* | 7/2008 | Bertin | B82Y 10/00 365/148 |
| 2013/0346721 A1* | 12/2013 | Giovannini | G11C 7/222 711/167 |
| 2015/0028919 A1* | 1/2015 | Ning | H03K 19/007 326/9 |
| 2015/0078057 A1* | 3/2015 | Gillingham | G06F 13/1689 365/63 |
| 2015/0099559 A1* | 4/2015 | Bendixen | H04W 76/14 455/552.1 |
| 2015/0286455 A1* | 10/2015 | Ferry | G06T 1/20 345/1.1 |
| 2016/0004463 A9* | 1/2016 | Deng | G06F 3/0605 711/103 |
| 2017/0103786 A1* | 4/2017 | Lee | G11C 5/02 |

* cited by examiner

NON-VOLATILE DUAL IN-LINE MEMORY MODULE (NVDIMM) MULTICHIP PACKAGE

CLAIM OF PRIORITY

The present Application for Patent claims priority to U.S. Provisional Application No. 62/338,514 entitled "Non-Volatile Dual In-Line Memory Module (NVDIMM) MULTI-CHIP PACKAGE", filed May 19, 2016, which is hereby expressly incorporated by reference.

FIELD

The present disclosure relates to integrating various silicon die components into a single multichip package. More specifically, the present disclosure relates to Non-Volatile Dual In-line Memory Modules (NVDIMM) in a multi-chip package (MCP).

BACKGROUND

Integrated circuits (IC's) have become such an integral part of so many daily activities that the needs for IC's continue to demand higher performance, lower cost, increased miniaturization of components, and greater packaging density of IC's. As new generations of IC products are released, their functionality increases while the size and number of components decreases. These demands make the IC's susceptible to damage during manufacturing and in use. Commonly, a package is used which both protects the circuit and provides electrical interconnections to external circuitry. The package often encases the IC and its connectivity to the electrical interconnections.

Integrated circuit (IC) devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a lead frame or on a multi-chip module substrate that is surrounded by a number of lead fingers. Each die has bonding pads that are then individually connected in a wire-bonding operation to the lead frame's lead finger pads using extremely fine gold or aluminum wires. The assemblies are then packaged by individually encapsulating them in molded plastic or ceramic bodies.

Computer memory modules, such as a Non-Volatile Dual In-line Memory Module (NVDIMM), are packaged as single silicon die packages. The NVDIMM can include random access memory (RAM) DIMM, Dynamic RAM (DRAM) components and non-volatile memory components, such as NAND flash devices. NVDIMMs can retain data even when electrical power is removed either from an unexpected power loss, system crash or from a normal system shutdown.

A typical NVDIMM is a very densely packed printed circuit board (PCB) assembly. There are a lot of integrate circuit packages that need to be included in a very small space, thus the NVDIMM PCB can be quite complex and costly. A significant amount of the NVDIMM PCB real estate is devoted to components of the NVDIMM such as the NVDIMM Controller (NVDC), Register Clock Driver (RCD), Multiplexer Switches (Switch), and Non-Volatile Memory (NVM) components. To lower the PCB cost and improve signal integrity margins, it would be beneficial to integrate several of these die into a single multichip package (MCP).

In view of the above, what is needed is a novel approach to integrating various combinations of the NVDC, RCD, SWITCH, and NVM silicon die into a single multichip package (MCP).

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a single multichip package if provided. The single multichip package includes a substrate having opposing upper and lower surfaces; a first die mounted on the upper surface of the substrate, the first die combining a first group of one or more components or component functions; a second die mounted on the upper surface of the substrate, the second die combining a second group of one or more components or component functions; a plurality of wire bonds connecting the first and second die; and a plurality of solder balls located on the lower surface of the substrate for mounting the single multichip package to a printed circuit board.

DETAILED DESCRIPTION

Various novel features will now be described in detail with reference to the accompanying drawings. In the following description, numerous specific details are set forth in order to provide a thorough understanding of the aspects described herein. It will be apparent, however, to one skilled in the art, that these and other aspects may be practiced without some or all of these specific details. In other instances, well known process steps and/or structures have not been described in detail in order to not unnecessarily obscure the description.

The term "comprise" and variations of the term, such as "comprising" and "comprises," are not intended to exclude other additives, components, integers or steps. The terms "a," "an," and "the" and similar referents used herein are to be construed to cover both the singular and the plural unless their usage in context indicates otherwise. The word "exemplary" is used herein to mean "serving as an example, instance, or illustration." Any implementation or embodiment described herein as "exemplary" is not necessarily to be construed as preferred or advantageous over other embodiments or implementations. Likewise, the term "embodiments" does not require that all embodiments include the discussed feature, advantage or mode of operation.

The term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another, even if they do not directly physically touch each other.

Typical NVDIMM Interconnect Scheme

As described previously, a Non-Volatile Dual In-line Memory Module (NVDIMM) is a computer memory module the can include random access memory (RAM) DIMM, Dynamic RAM (DRAM) components and non-volatile memory components, typically NAND flash devices, for example. NVDIMMs can retain data even when electrical power is removed either from an unexpected power loss, system crash or from a normal system shutdown.

Figure 1:
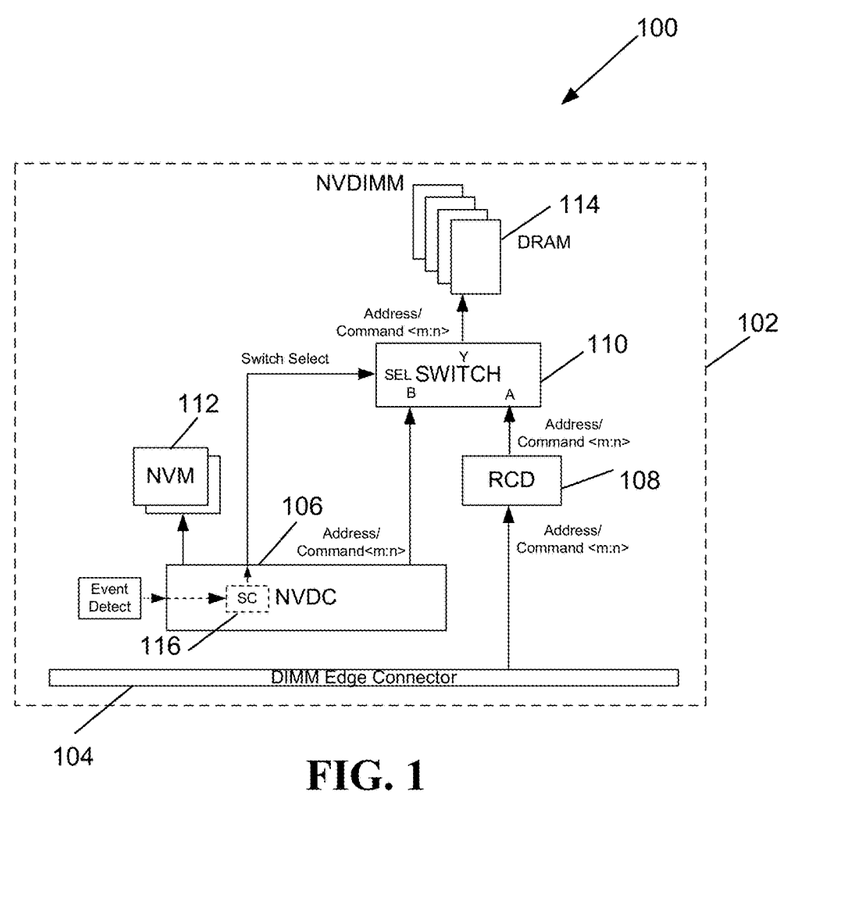
FIG. 1 illustrates a typical Non-Volatile Dual In-Line Memory Module interconnection scheme.

In addition to memory components, NVDIMMs also contain additional logic and memory devices. FIG. 1 illustrates a NVDIMM interconnection scheme 100. On traditional NVDIMM products, the NVDIMM Controller (NVDC), Register Clock Driver (RCD), Multiplexer Switches (SWITCH), and Non-Volatile Memory (NVM) components are implemented in discrete integrated circuit packages soldered to the NVDIMM printed circuit board. They are typically interconnected as shown in FIG. 1.

As shown, the NVDIMM interconnection scheme 100 comprises a printed circuit board 102 having a DIMM edge connector 104 that mates with a DIMM socket (not shown). The logic and memory devices may include, for example, a NVDIMM Controller (NVDC) 106, a Register Clock Driver (RCD) 108, Multiplexer Switches (SWITCH) 110, Non-Volatile Memory (NVM) 112, volatile memory such as Dynamic Random-Access Memory (DRAM) 114 and a Switch Control (SC) 116.

The NVDIMM Controller (NVDC) 106 is an integrated circuit, typically an application-specific integrated circuit (ASIC) or a field-programmable gate array (FPGA), which facilitates the transfer of data between the DRAM 114 (volatile memory) and the Non-Volatile Memory (NVM) 112 located on the module 100. The Non-Volatile Memory 112 is typically comprised of one or more NAND flash memory devices. NAND flash memory are non-volatile memory devices, i.e. data held in the devices is preserved in the absence of power. With this capability, the NVDIMM is able to save or "backup" the data held in DRAM 114 to the NAND flash devices 112, in the event of specific system events, such as a power failure.

The Register Clock Driver 108 captures address and command signals sent from either the host computer system or the on-module NVDIMM controller 106 integrated circuit and presents registered versions of these signals to the DRAM components 114.

The Multiplexer Switches 100 perform 1-to-2 multiplex/demultiplex function enabling shared access between the NVDC memory controller 106 and the host computer system memory controller to the address/command input pins/bus of the DRAM 114 (volatile memory).

The Switch Control (SC) 116 is logic incorporated into a discrete integrated circuit, the NVDC 106, or the RCD 108, which interprets host system events, such as a power failure. The SC generates the "switch select" signal, which determines the port selection of the SWITCH thereby allowing data to be transferred from volatile memory to non-volatile memory.

Die Integrated Circuit Package

Figure 2:
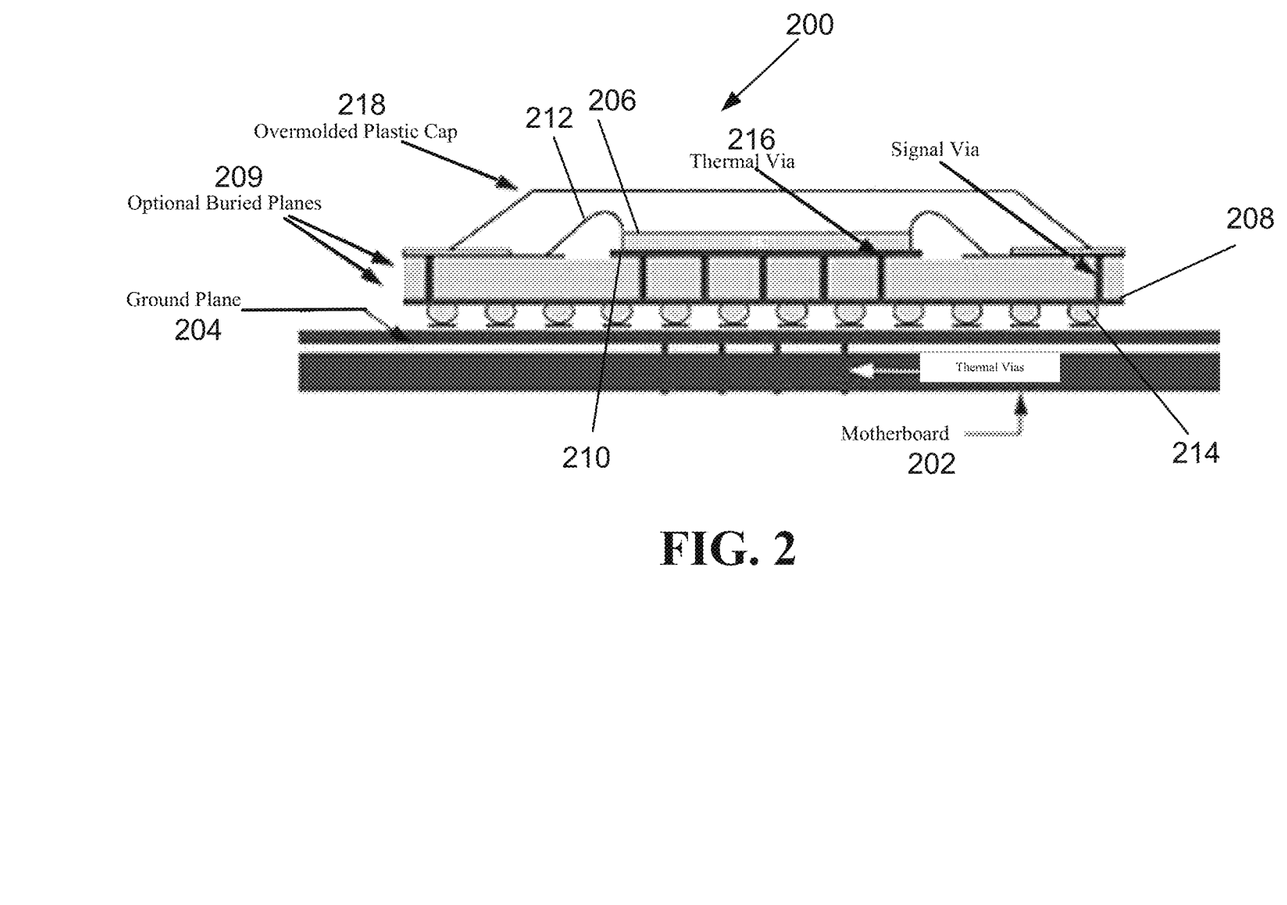
FIG. 2 illustrates a die integrated circuit package.

FIG. 2 illustrates a die integrated circuit package 200. The die integrated circuit package 200 of FIG. 2 illustrates the components of FIG. 1 packaged as single silicon die packages. As shown, the package 200 includes a motherboard or printed circuit board 202 having a ground plane 204 formed therein. An integrated circuit die 206 is attached to a substrate 208 (optionally having buried planes therein 209) by die attach material 210 and is interconnected with wire bond 212. The die attach material 210 can be any number of well-known adhesives including a silver filled epoxy that provides excellent thermal and electrical conductivity, or any others having strong adhesion properties.

The integrated circuit die 206 is coupled through a plurality of solder balls 214 and thermal vias 216 to the printed circuit board 202. An overmolded plastic cap 218 encapsulates the die 206, wire bonds 212 and all or part of the upper surface of the substrate 208.

Multichip Package (MCP)

Figure 3A:
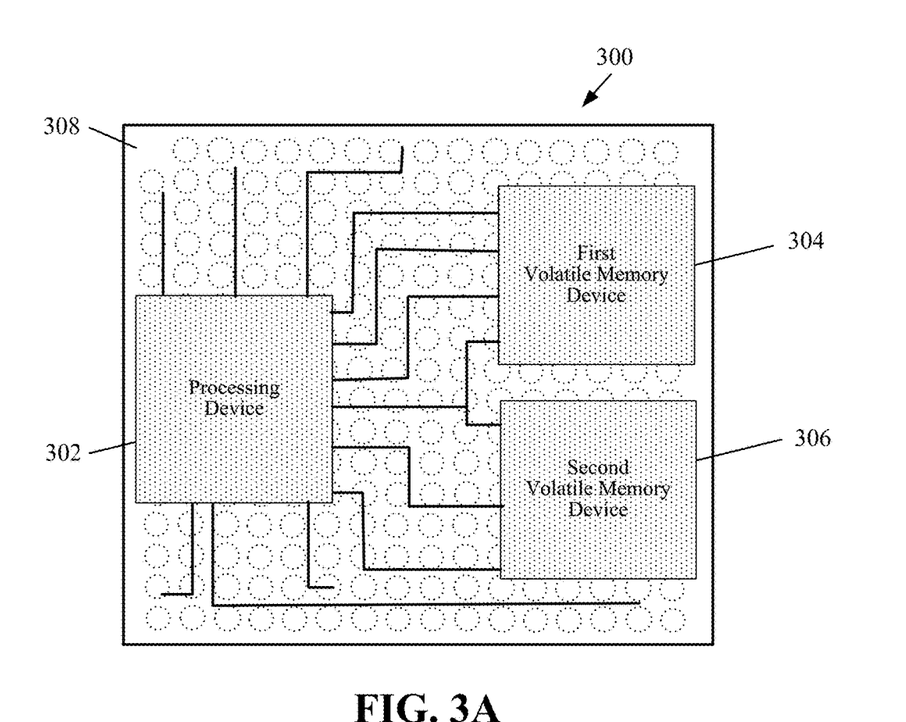
FIG. 3A illustrates a top plan view a multichip package.
Figure 3B:
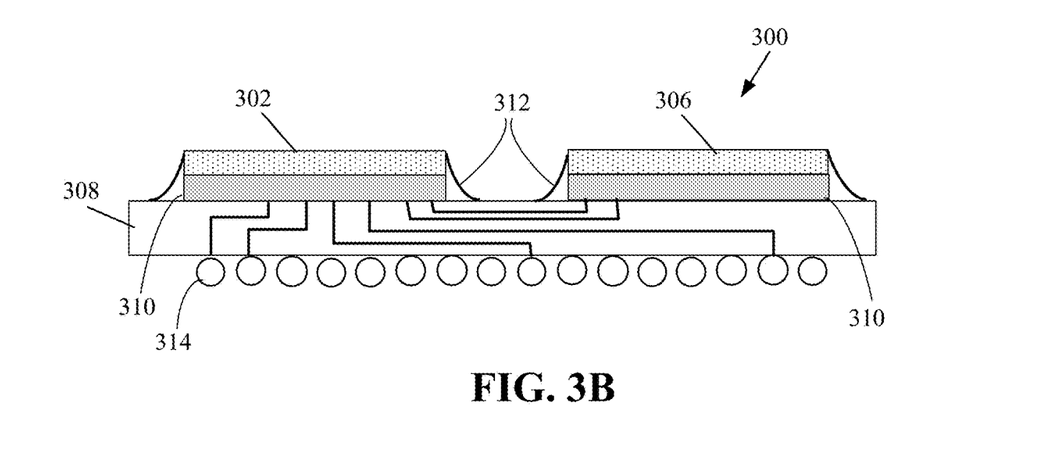
FIG. 3B illustrates a side elevation view the multichip package of FIG. 3A.

To save space on a PCB and to reduce electrical loading, multiple silicon die may be integrated into a multichip package (MCP). FIG. 3A illustrates a top plan view of a multichip package (MCP) 300. FIG. 3B illustrates a side elevation view of the multichip package (MCP) 300 of FIG. 3A. As shown, a microprocessor 302, a first volatile memory device 304 (e.g., static random access memory SRAM, synchronous SRAM, etc.) and a second volatile memory device 306 are mounted to a substrate 308 by die attach material 310 and are interconnected with wire bond 312. The die attach material 310 can be any number of well-known adhesives including a silver filled epoxy that provides excellent thermal and electrical conductivity, or any others having strong adhesion properties.

The microprocessor 302, the first volatile memory device 304 and the second volatile memory device 306 are coupled through a plurality of solder balls 314 for mounting on a printed circuit board (not shown).

A Single Multichip Package Integrated with a Plurality of Die

A multichip package is a packaging configuration containing a plurality of die connected via wire bonds in a single device that can be connected or mounted to a multilayer printed circuit board. The single device with the plurality of die are protected by either a molded encapsulant or a low-cost ceramic package. The various components or die of a multichip package are mounted on a substrate, and the bare dies of the substrate are connected to the surface via wire bonding, tape bonding or flip-chip bonding. The various components or die of the module can be encapsulated by a plastic molding and is mounted on the printed circuit board.

Multichip packages offer better performance and can reduce the size of a device considerably. Additionally, the use of multichip packages help to reduce the cost of printed circuit boards and improve signal integrity margins. The cost of the printed circuit boards are reduced as real estate on a printed circuit board is expensive and generally there are a lot of integrated circuit packages that need to be included on the printed circuit board. Signal integrity may be improved due to the shortened interconnect lengths or wires bonds between the die.

A NVDIMM is a very densely packed printed circuit board (PCB) assembly including a lot of integrated circuit packages that need to be included in a very small space. Thus, the NVDIMM PCB can be quite complex and costly. A significant amount of the NVDIMM PCB real estate is devoted to certain components. According to one example, the components may include, but are not limited to, the NVDC, RCD, SWITCH, and NVM components. As such, to lower the PCB cost and improve signal integrity margins, it would be beneficial to integrate several of these components or component functions into a die in a single MCP.

According to one embodiment, the present disclosure provides a single multichip package having one or more die combining multiple component functions or components. The single multichip package comprises a substrate having opposing upper and lower surfaces in which the one or more die are mounted on the upper surface of the substrate. According to one example, a first die may be mounted on the upper surface of the substrate where the first die combines a first group of one or more components or component functions as described below. This example may also include a second die mounted on the upper surface of the substrate where the second die combines a second group of one or more components or component functions as described below. The combination of components or component functions in the first die are different than the combination of components or component functions in the second die. Although two die are described in this example, this is by way of example only and less than two die may be included in the single multichip package or more than two die may be included in the single multichip package. A plurality of wire bonds may be utilized to connect the first and second die on the upper surface of the substrate. A plurality of solder balls may located on the lower surface of the substrate for mounting the single multichip package to a printed circuit board. The first and second die and wire bonds may be protected by a molded encapsulant or a low-cost ceramic package, for example.

Figure 4:
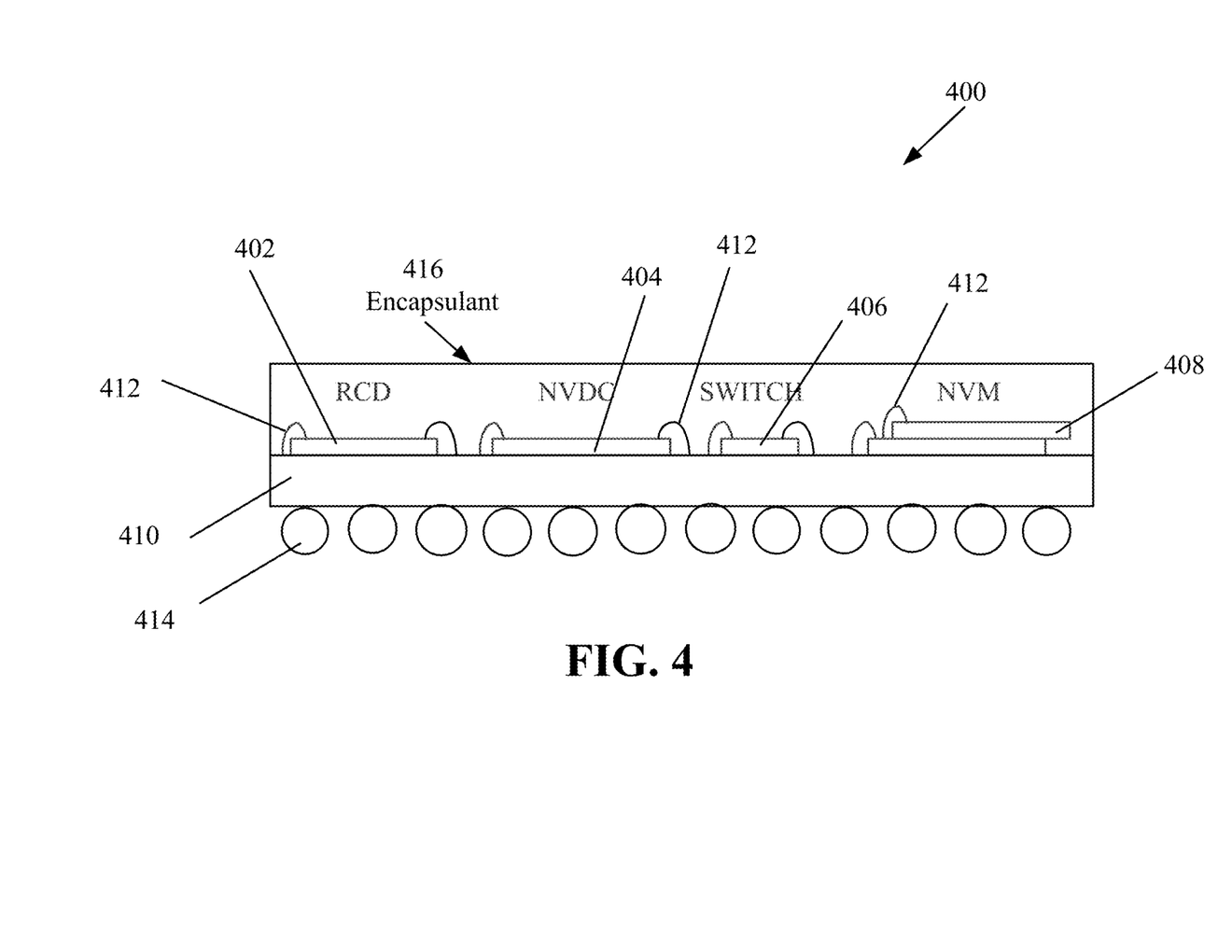
FIG. 4 illustrates a single multichip package with integrated non-volatile memory dies, non-volatile memory (e.g., DIMM) controller die, register clock driver (RCD) die, and a multiplexer switch die.

FIG. 4 illustrates a specific example of a single multichip package (MCP) 400 integrated with multiple silicon die. By way of example only, the single multichip package (MCP) 400 may be integrated with non-volatile memory (NVM) devices, non-volatile memory (e.g., DIMM) controller (NVDC), register clock driver (RCD), and SWITCH Silicon Die. These components or component functions are by way of example only and other components or component functions may be included in a die that may be included in the single MCP.

As shown in the example of FIG. 4, the MCP 400 may include a Register Clock Driver (RCD) die 402, a NVDC die 404, a multiplexer switch die 406, and one or more NVM die 408 mounted to a substrate 410 having opposing upper and lower surfaces 410. According to one example, the die are interconnected with wire bonds 412. Each die 402, 404, 406 and 408, mounted on the upper surface of the substrate 410 may be coupled to a printed circuit board (not shown) through a plurality of solder balls 414 mounted on the lower surface of the substrate. The solder balls 414 may be utilized to mount the substrate to a printed circuit board. According to one example, the plurality of die and wire bonds 412 may be protected by a molded encapsulant 416 or a low-cost ceramic package, for example.

This novel approach allows for integrating various combinations of the NVDC, RCD, Switch, and NVM silicon die into a single MCP. This integration has the benefits of 1) reduced NVDIMM PCB real estate requirements and 2) reduced parasitic electrical loading on the signals interconnecting the various components, yielding a lower cost PCB with improved signal integrity margins.

Various combination of components may be integrated into a single MCP.

Figure 5:
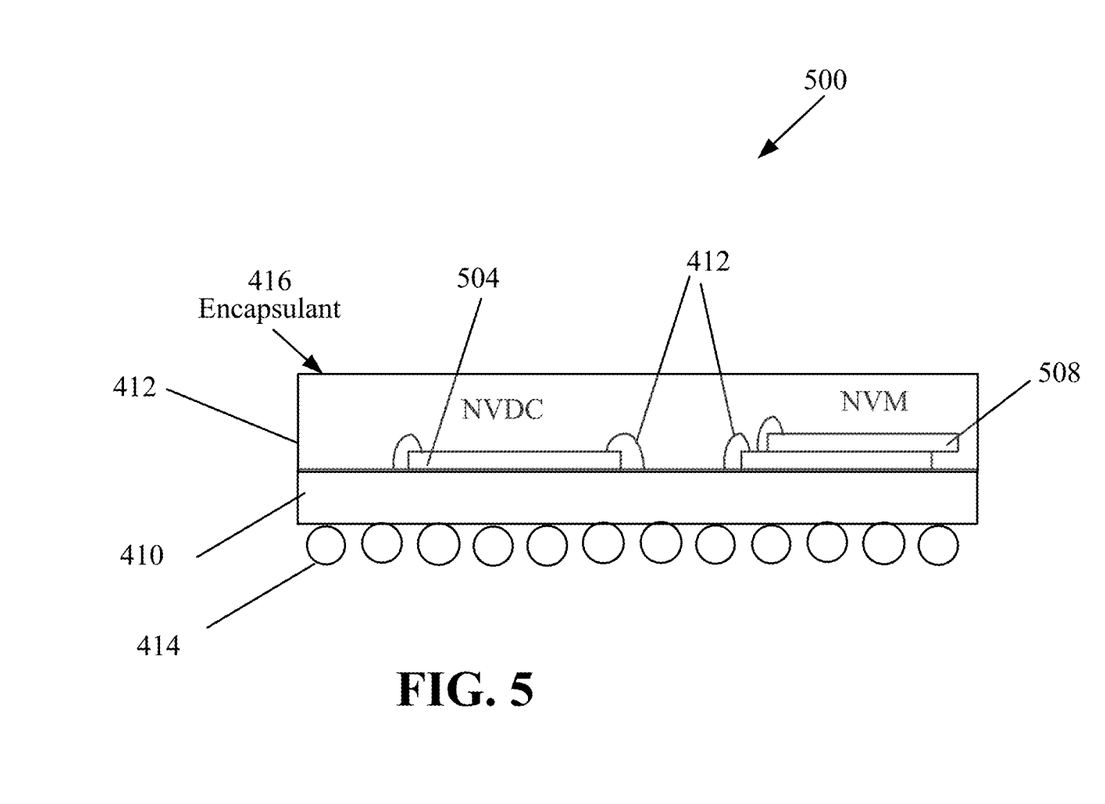
FIG. 5 illustrates a second example of a single multichip package (MCP) integrated with multiple silicon die.

FIG. 5 illustrates a second example of a single multichip package (MCP) 500 integrated with multiple silicon die. This example is similar to that illustrated in FIG. 4 but with only non-volatile memory die 508 and a NV DIMM controller die 504 integrated into a single multichip package.

Figure 6:
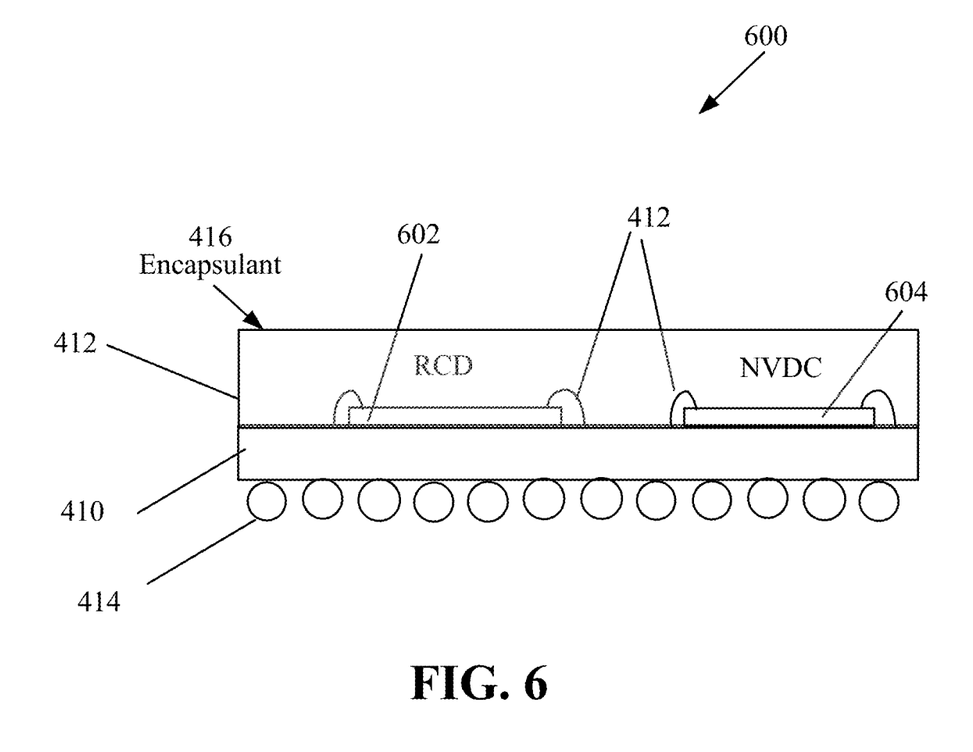
FIG. 6 illustrates a third example of a single multichip package (MCP) integrated with multiple silicon die.

FIG. 6 illustrates a third example of a single multichip package (MCP) 600 integrated with multiple silicon die. This example is similar to that illustrated in FIG. 4 but with only non-volatile memory controller (NVDC) die 604 and a register clock driver (RCD) die 602 integrated into a single multichip package.

Figure 7:
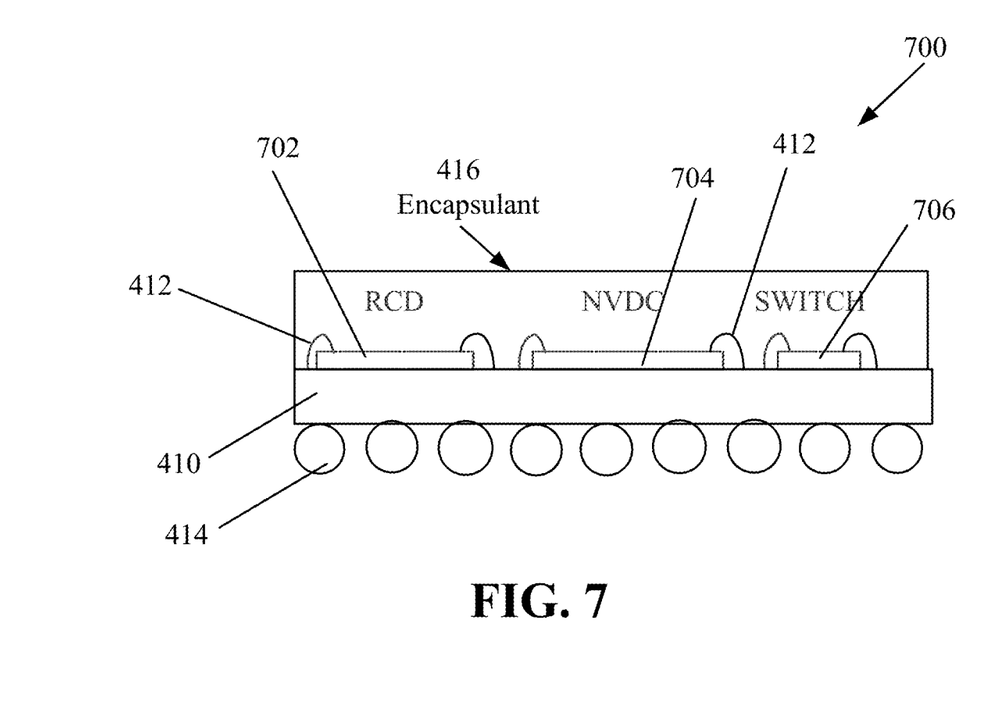
FIG. 7 illustrates a fourth example of a single multichip package (MCP) integrated with multiple silicon die.

FIG. 7 illustrates a fourth example of a single multichip package (MCP) 700 integrated with multiple silicon die. This example is similar to that illustrated in FIG. 4 but with only non-volatile memory controller (NVDC) die 704, a register clock driver (RCD) die 702, and a multiplexer switch die 706 integrated into a single multichip package.

Figure 8:
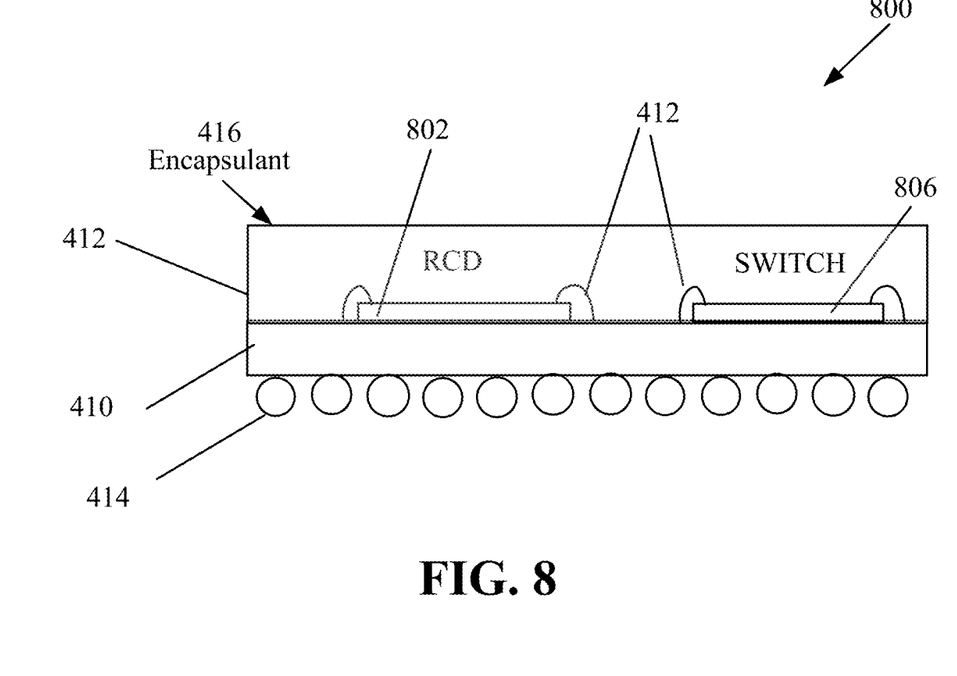
FIG. 8 illustrates a fifth example of a single multichip package (MCP) integrated with multiple silicon die.

FIG. 8 illustrates a fifth example of a single multichip package (MCP) 800 integrated with multiple silicon die. This example is similar to that illustrated in FIG. 4 but with only a register clock driver (RCD) die 802 and a multiplexer switch die 806 integrated into a single multichip package.

Additionally, various components and/or functions may be combined or merged into a single die. In one example, the NVDC and RCD dies or functions may be combined into a single die. In a second example, the NVDC, RCD, and multiplexer switch dies or functions may be combined into a single die. In a third example, the multiplexer switch and RCD may be combined into a single die. In a fourth example, a Switch Control (SC) and RCD may be combined into a single die.

In various implementations, the components illustrated in FIGS. 4, 5, 6, 7, and/or 8 may be implemented in a single die package or combined with other die in an MCP. In some implementations, the various combinations of dies illustrated in FIGS. 4, 5, 6, 7, and/or 8 may be arranged in a stacked configuration in a single MCP.

Furthermore, a NVDIMM can be developed with control functions comprised of a single MCP encompassing NVDC, SWITCH, RCD, and NVM functions, or a multi-component chipset including at least one MCP and at least one integrated circuit (single die package), or multiple MCPs, collectively implementing all NVDIMM control functions (i.e. NVDC, RCD, SWITCH, SC, and NVM).

Applications which can benefit from multichip packages may include, but are not limited to, radio frequency wireless modules, power amplifiers, high-power communication devices, light emitting diodes (LED) packages, high-density single module computers, servers, portable electronics, and wearable computers.

One example provides a single multichip package, comprising: a substrate having opposing upper and lower surfaces, a first die mounted on the upper surface of the substrate, a second die mounted on the upper surface of the substrate, a plurality of wire bonds connecting the first die and the second die, and a plurality of solder balls located on the lower surface of the substrate for mounting the single multichip package to a printed circuit board, the plurality of solder balls electrically coupled to the first die and the second die. The first die may include one or more non-volatile memory devices. For instance, the one or more non-volatile memory devices may be dual in-line memory modules (DIMM). The second die may include at least one of: (a) a non-volatile memory controller that facilitates transfer of data to and from the one or more non-volatile memory devices, (b) a register clock driver for volatile memory devices, and/or (c) one or more multiplexer switches configured to switch between two or more of the volatile memory devices. Additionally, an encapsulant may enclose the first die, the second die and the plurality of wire bonds to the upper surface of the substrate.

In some instances, the non-volatile memory controller may be configured to transfer data between the volatile memory devices and the one or more non-volatile memory devices. Upon detection of a powerloss condition, the non-volatile memory controller may be configured to transfer data from the volatile memory devices to the one or more non-volatile memory devices. Upon detection of a power restored condition, the non-volatile memory controller is configured to transfer data from the one or more non-volatile memory devices to the volatile memory devices.

In one implementation, the non-volatile memory controller may be coupled to the one or more multiplexer switches, and the one or more multiplexer switches may be configured to be selectively switched between the volatile memory devices and the one or more non-volatile memory devices.

In one example, the second die is the non-volatile memory controller.

In another example, the second die implements both the non-volatile memory controller and the register clock driver.

In another example, the second die implements the non-volatile memory controller, the register clock driver, and the one or more multiplexer switches.

In another example, the second die implements the register clock driver and the one or more multiplexer switches.

According to another aspect, the second die may further include a switch control (SC) configured to trigger change of data flow in the one or more multiplexer switches.

The integration of the first die and second die reduces parasitic electrical loading on signals interconnecting the various components of the first die and the second die.

In yet another example, a non-volatile dual in-line memory module (NVDIMM) may provide integrated control functions, and comprises: at least one multichip package (MCP) including: a substrate having opposing upper and lower surfaces; a first die mounted on the upper surface of the substrate, the first die including one or more non-volatile memory devices; a second die mounted on the upper surface of the substrate, the second die including at least one of: (a) a non-volatile memory controller that facilitates transfer of data to and from the one or more non-volatile memory devices, (b) a register clock driver for volatile memory devices, and/or (c) one or more multiplexer switches configured to switch between two or more of the volatile memory devices; a plurality of wire bonds connecting the first die and the second die; and a plurality of solder balls located on the lower surface of the substrate for mounting the single multichip package to a printed circuit board, the plurality of solder balls electrically coupled to the first die and the second die.

Another exemplary implementation provides an integrated circuit die, comprising: a non-volatile memory controller that facilitates transfer of data to and from one or more non-volatile memory devices; a register clock driver for volatile memory devices; and/or one or more multiplexer switches configured to switch between two or more of the volatile memory devices.

This integrated circuit die may be configured to selectively perform some or all of the functions of the non-volatile memory controller, the register clock driver, and the one or more multiplexer switches. For instance, the integrated circuit die may include circuits and functionality for the non-volatile memory controller, the register clock driver, and the one or more multiplexer switches, but one or more of these functionalities may be selectively disabled (e.g., by input pins or programmable fuses, etc.) so that only some of the functions (but not all) operate. Consequently, the integrated circuit may be configured to enable only the non-volatile memory controller and the register clock driver, but not the one or more multiplexer switches. Or the integrated circuit may be configured to enable only the register clock driver and the one or more multiplexer switches, but not the non-volatile memory controller. Likewise, the integrated circuit may be configured to enable only the non-volatile memory controller and the one or more multiplexer switches, but not the register clock driver. This may permit implementations where the missing functionality may be provided on a separate integrated circuit die.

One or more of the components and functions illustrated the figures may be rearranged and/or combined into a single component or embodied in several components without departing from the invention. Additional elements or components may also be added without departing from the invention. Additionally, the features described herein may be implemented in software, hardware, as a business method, and/or combination thereof.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. A single multichip package, comprising:
   a substrate having opposing upper and lower surfaces;
   a first die mounted on the upper surface of the substrate, the first die including one or more non-volatile memory devices;
   a second die mounted on the upper surface of the substrate, the second die including at least one of: (a) a non-volatile memory controller that facilitates transfer of data to and from the one or more non-volatile memory devices, (b) a register clock driver for volatile memory devices, and/or (c) one or more multiplexer switches configured to switch between two or more of the volatile memory devices;
   a plurality of wire bonds connecting the first die and the second die; and
   a plurality of solder balls located on the lower surface of the substrate for mounting the single multichip package to a printed circuit board, the plurality of solder balls electrically coupled to the first die and the second die.
2. The package of claim 1, further comprising an encapsulant enclosing the first die, the second die and the plurality of wire bonds to the upper surface of the substrate.

3. The package of claim 1, wherein the one or more non-volatile memory devices are dual in-line memory modules (DIMM).

4. The package of claim 1, wherein the non-volatile memory controller is configured to transfer data between the volatile memory devices and the one or more non-volatile memory devices.

5. The package of claim 1, wherein upon detection of a powerloss condition, the non-volatile memory controller is configured to transfer data from the volatile memory devices to the one or more non-volatile memory devices.

6. The package of claim 5, wherein upon detection of a power restored condition, the non-volatile memory controller is configured to transfer data from the one or more non-volatile memory devices to the volatile memory devices.

7. The package of claim 1, wherein the non-volatile memory controller is coupled to the one or more multiplexer switches, and the one or more multiplexer switches are configured to be selectively switched between the volatile memory devices and the one or more non-volatile memory devices.

8. The package of claim 1, wherein the second die is the non-volatile memory controller.

9. The package of claim 1, wherein the second die implements both the non-volatile memory controller and the register clock driver.

10. The package of claim 1, wherein the second die implements the non-volatile memory controller, the register clock driver, and the one or more multiplexer switches.

11. The package of claim 1, wherein the second die implements the register clock driver and the one or more multiplexer switches.

12. The package of claim 1, wherein the second die further includes a switch control (SC) configured to trigger change of data flow in the one or more multiplexer switches.

13. The package of claim 1, wherein integration of the first die and second die reduces parasitic electrical loading on signals interconnecting the various components of the first die and the second die.

14. A non-volatile dual in-line memory module (NVDIMM) having integrated control functions, comprising:
  at least one multichip package (MCP) comprising:
    a substrate having opposing upper and lower surfaces;
    a first die mounted on the upper surface of the substrate, the first die including one or more non-volatile memory devices;
    a second die mounted on the upper surface of the substrate, the second die including at least one of: (a) a non-volatile memory controller that facilitates transfer of data to and from the one or more non-volatile memory devices, (b) a register clock driver for volatile memory devices, and/or (c) one or more multiplexer switches configured to switch between two or more of the volatile memory devices;
    a plurality of wire bonds connecting the first die and the second die; and
    a plurality of solder balls located on the lower surface of the substrate for mounting the single multichip package to a printed circuit board, the plurality of solder balls electrically coupled to the first die and the second die.

\* \* \* \* \*